United States Patent [19]

Asher et al.

[11] Patent Number: 5,281,370
[45] Date of Patent: Jan. 25, 1994

[54] METHOD OF MAKING SOLID CRYSTALLINE NARROW BAND RADIATION FILTER

[75] Inventors: Sanford A. Asher; Sesh Jagannathan, both of Pittsburgh, Pa.

[73] Assignee: University of Pittsburgh of the Commonwealth System of Higher Education, Pittsburgh, Pa.

[21] Appl. No.: 571,251

[22] Filed: Aug. 22, 1990

[51] Int. Cl.⁵ .................... B29D 11/00; B06B 1/02
[52] U.S. Cl. .................... 264/1.1; 264/22; 264/24; 264/108
[58] Field of Search .................... 264/1.1, 1.3, 1.7, 24, 264/22, 108; 350/311, 362

[56] References Cited

U.S. PATENT DOCUMENTS

| | | | |
|---|---|---|---|
| 4,099,854 | 7/1978 | Decker et al. | 350/312 |
| 4,140,369 | 2/1979 | Howland | 350/126 |
| 4,451,412 | 5/1984 | Loiseaux et al. | 264/1.3 |
| 4,548,473 | 10/1985 | Lo et al. | 350/311 |
| 4,627,689 | 12/1986 | Asher | 350/362 |
| 4,632,517 | 12/1986 | Asher | 350/362 |
| 4,717,508 | 1/1988 | DeMartino | 252/583 |
| 4,720,355 | 1/1988 | DeMartino | 252/582 |
| 4,766,171 | 8/1988 | DeMartino | 524/722 |
| 4,803,688 | 2/1989 | Lawandy | 372/21 |

OTHER PUBLICATIONS

Philipse, "Solid opaline packings of colloidal silica spheres," Journal of Mat'l's Science Letters 8 (1989) (1371-1373).

*Primary Examiner*—Jan H. Silbaugh
*Assistant Examiner*—Christopher A. Fiorilla
*Attorney, Agent, or Firm*—Arnold B. Silverman

[57] ABSTRACT

A method of making a solid filter material which filters a predetermined wavelength band from a broader spectrum of radiation includes creating a colloidal structure composed of particles dispersed within a medium, and introducing a solvent thereto. Thereafter, the solvent is evaporated and the remaining structure solidifies into a solid crystalline array. Another embodiment of the method includes electrophoretically attracting the particles in a medium to form an ordered array. The particles can also be fused together by polymerization using one of several methods which are provided. Additionally, one aspect of the invention involves coating the particles with an electrostatically-charged material to facilitate inter-particle interactions.

18 Claims, 2 Drawing Sheets

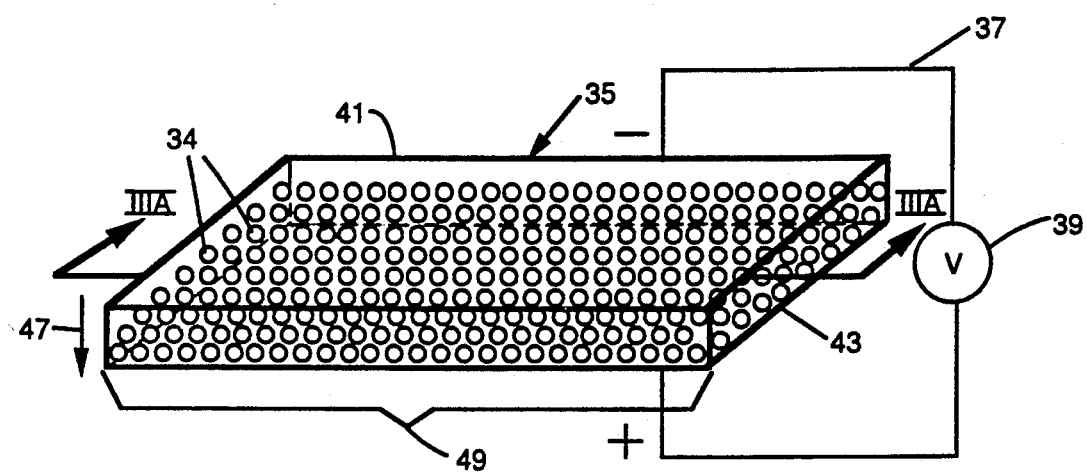
FIG. 3
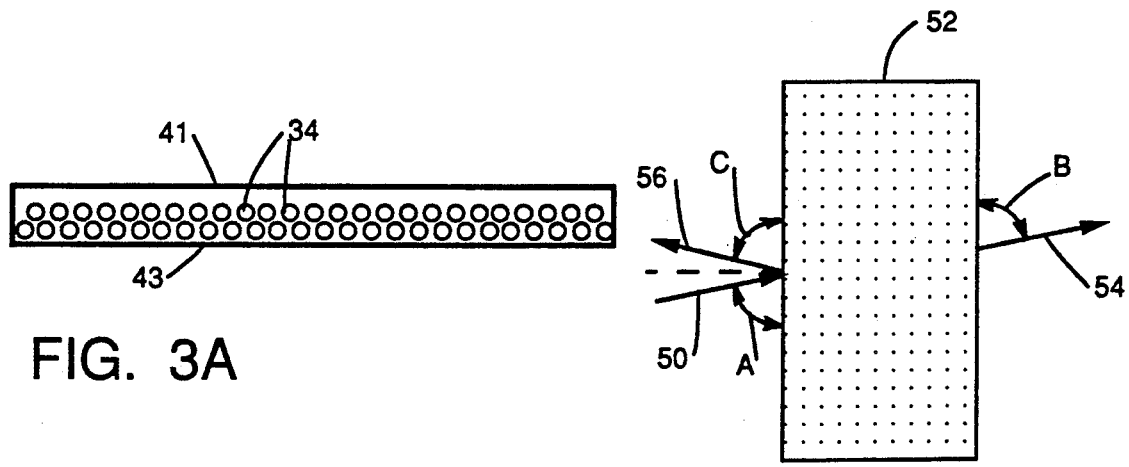
FIG. 3A
FIG. 4
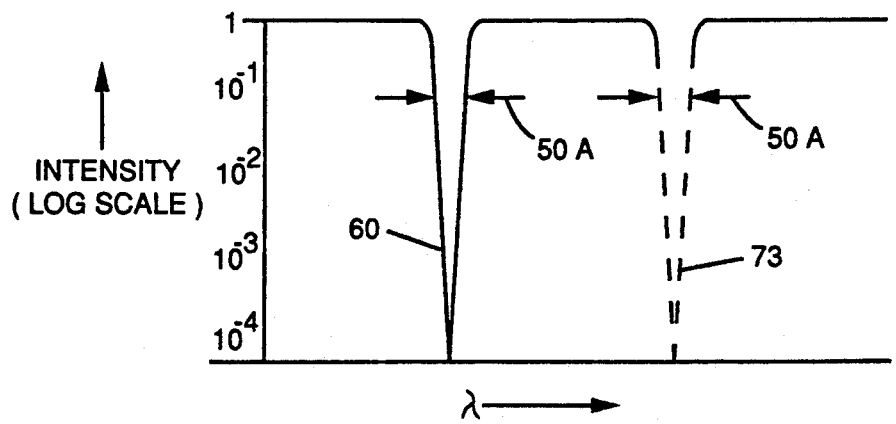
FIG. 5

METHOD OF MAKING SOLID CRYSTALLINE NARROW BAND RADIATION FILTER

This invention was made with government support under Contract F3315-88-C-5432 awarded by the Department of the Air Force. The government has certain rights in the invention.

BACKGROUND OF THE INVENTION

1. Field of the Invention

The present invention relates generally to a method of creating filters which may be used to select and/or reject predetermined frequencies of electromagnetic radiation. The invention relates more particularly to a method of making solid crystalline materials in which colloidal electrically charged particles form an ordered dispersion and are solidified into a hardened material which has certain predetermined filtering characteristics.

2. Description of the Prior Art

It has been recognized that colloidal dispersions of polymer particles in various solvents can form crystalline structures having lattice spacings comparable to the wavelength of ultraviolet, visible and infrared radiation. Bragg diffraction techniques have been used to examine these polymer colloidal crystals with a view towards identifying their interparticle spacing, lattice parameters and phase transitions. My U.S. Pat. No. 4,627,689 discloses a crystalline narrow band radiation filter which is made by forming a highly ordered Crystalline colloidal structure within cell. My U.S. Pat. No. 4,632,517 also discloses a narrow wavelength band filtering device created by forming a highly ordered crystalline colloidal structure within a cell.

More recently, it has been known that these crystalline structures can be very useful and that such structures have many practical applications for filter devices. In many instances it is necessary or desirable to filter out narrow bands of selected wavelengths from a broader spectrum of incident radiation while permitting the transmission of adjacent wavelengths. High spectral-purity commercial monochromators which are available for this purpose generally use a plurality of gratings and prisms. However, such devices are extremely complex, bulky and expensive.

As mentioned hereinbefore, U.S. Pat. No. 4,627,689 discloses a crystalline colloidal narrow band radiation filter which is made by forming a highly ordered crystalline colloidal structure within a cell. The crystalline colloidal structure is formed by dispersing electrically charged particles, for example, polystyrene particles within an appropriate solvent.

U.S. Pat. No. 4,632,517 discloses another crystalline colloidal narrow band radiation filter involving polystyrene particles. The device of this patent forms the basis for a mechanically simple and highly efficient monochromator. It has application in improved systems for investigating Raman or emission spectra of selected sample materials. U.S. Pat. No. 4,632,517 does allude to a type of solid structure in that it suggests that a lattice spacing gradient may be formed and as part of this process a "freezing" of certain conditions could be achieved using polymerization techniques. However, this suggestion did not disclose the unique aspects of the method of the present invention for forming filtering devices which are entirely solid and self-supporting. U.S. Pat. Nos. 4,627,689 and 4,632,517, are expressly incorporated herein by reference.

Other filtering devices have also been known. See, for example, U.S. Pat. No. 4,803,688 which discloses ordered colloidal suspension optical devices. This patent relates to the addition of a water based polymer to a colloidal structure.

Although an allusion was made to solid devices in above-mentioned prior art, the above patents involve crystalline colloidal structures which are not solids and are not self-supporting. Because of their high peak absorbance value, state-of-the-art colloidal crystalline array filters may be widely used for eye protection and sensor protection. However, a more rugged filter would obviously have wider application. Thus, there has been a need for a solid filter. Solids provide better mechanical stability and machinability. Non-solids, on the other hand, are subject to become disordered upon vibration. In addition, liquid media can undergo phase transitions quite easily by freezing or boiling and this may often be undesirable.

For these reasons a solid structure is more desirable in many applications. For example, solid filtering devices are often necessary for filtering out certain bands of radiation in aviation and space travel, as they provide mechanical rigidity and this allows for a greater range of design features. It has heretofore been an extremely difficult polymer chemistry problem to create a solid filter.

Therefore, there remains a need for a solid crystalline filtering device.

SUMMARY OF THE INVENTION

These and other needs are satisfied by the present invention which provides a simple and relatively inexpensive method of creating a solid narrow band radiation filter and related filter devices. The narrow band radiation filter selectively and effectively filters a narrow band of wavelengths from a broader spectrum of incident radiation while transmitting adjacent wavelengths to a high degree. For example, a filter can be produced in accordance with the present invention which filters out greater than about 99 to 99.999% of a wavelength band of about 50 to 150 Å while transmitting more than about 70 to 90% of the intensity of remaining wavelengths.

A method of making the filter is also disclosed in which a crystalline structure is created which is composed of particles dispersed in a liquid medium. As used herein, "particles" includes any shape suitable for the desired filtering need, but preferably the particles for the present invention will be spheres. In accordance with one aspect of the invention, a solvent is introduced into the crystal structure that fuses the particles together. Thereafter, the solvent is evaporated to condense the particles into a three-dimensional array having a highly periodic lattice spacing. The lattice spacing is created such that it can diffract a predetermined wavelength band.

As noted hereinbefore, the particles are fused together and a geometric ordering occurs. The lattice structure exists largely due to electrical repulsive forces between the particles which each have a charge of the same polarity. Several different methods of fusing the particles together are disclosed which are set forth in further detail hereinafter.

One aspect of the method of securing the particles in the desired relative position together involves polymerization of the medium surrounding the particles to fix the particles in the desired relative spaced relationship to each other. A particular method of such polymerization includes adding acrylamide or bisacrylamide and preferably a nonionic UV photoinitiator to a colloidal solution contained between two quartz plates. Ultraviolet light is then utilized to initiate the polymerization.

In accordance with another embodiment of the method a polymer solution is introduced into the region around the polystyrene spheres. This polymer rigidizes the medium and fixes the sphere positions. The polymer may be an organic or inorganic material.

An alternate method includes providing particles, which may be polystyrene, polymethyl methacrylate or silica spheres, for example, in colloidal form with a coating which provides a film of polymerizing residue on the surfaces of the particles. The ordered colloidal array is formed and is then solidified by polymerizing together the adjacent sphere surfaces.

Another method of the invention involves packing the particles utilizing an electric field to attract the particles and further enhance the ordering of the array. Subsequent to achieving this ordering, polymerizing may be effected with the assistance of the electric field which will electrochemically initiate polymerization of material, such as acrylamide and bisacrylamide, for example.

The device resulting from the methods of this invention can form the basis for a mechanically simple and highly efficient filter which is useful in many applications, such as, for example, sensor protection, eye protection, scientific instrumentation and medical instrumentation in laser surgery. Such filters can also eliminate the need for dichroic mirrors in Optic technology. Overall, the device can be used with any product in which the disclosed radiation filtering characteristics are desirable.

It is an object of the present invention to provide an inexpensive, simple method of creating a solid crystalline structure having predetermined filtering characteristics.

It is another object of the invention to provide a method of creating a solid filter which can effectively filter a predetermined narrow wavelength band from a broader spectrum of incident radiation.

These and other objects of the invention will be more fully understood from the following description of the invention, with reference to the illustrations appended hereto.

BRIEF DESCRIPTION OF THE DRAWINGS

FIG. 3 is a schematic illustration of the electrophoretic method of organizing and polymerizing the particles in a packed array.

FIG. 3A is a cross section of the array taken along line IIIA—IIIA of FIG. 3.

FIG. 4 is a schematic illustration of the angle at which radiation is diffracted using the filter of the present invention.

FIG. 5 is a representation of a spectrum indicating the narrow band wavelengths which can be filtered using devices created in accordance with the present invention.

DESCRIPTION OF THE PREFERRED EMBODIMENTS

Figure 1:
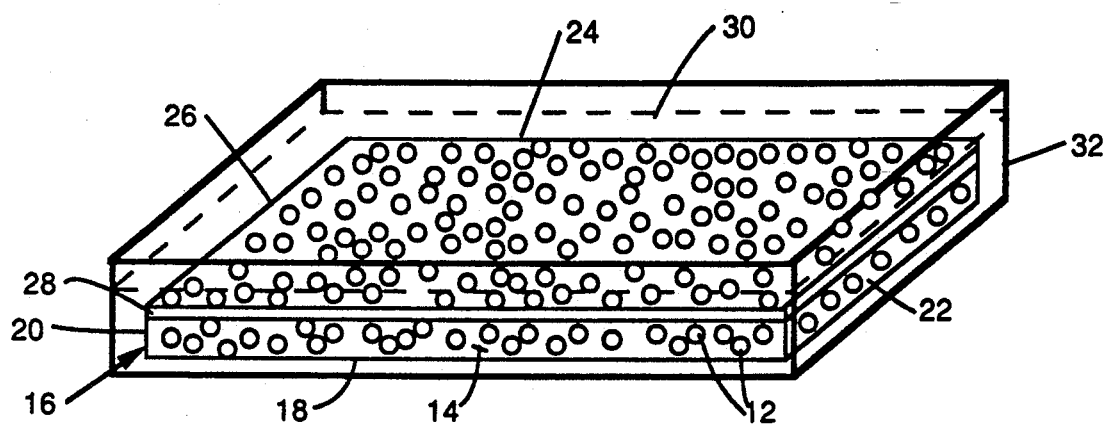
FIG. 1 is a schematic illustration of colloidal particles dispersed within a medium prior to ordering of the particles in accordance with one aspect of the present invention.

With reference to FIG. 1, there is shown a schematic illustration of a group of particles 12 prior to ordering of the array which is discussed hereinafter. Particles 12 are interdisposed within a medium 14. As will be discussed more fully hereinafter, the filtering characteristics of the filtering device so created may be varied by controlling the spacing between the particles 12 or by altering the shape and size of the particles 12.

Although not limiting to the invention, in a preferred form, particles 12 are preferably composed of polystyrene, polymethylmethacrylate, silicon dioxide, aluminum oxide, polytetrafluoroethylene or other suitable materials which are generally uniform in size and electrical charge. The material chosen depends upon the optimum degree of ordering desired in the resulting lattice. The higher the ordering of the lattice structure, the narrower the wavelength band which may be filtered with the resulting filtering device. Other parameters also affect filtering characteristics such as particle size and shape.

Particles 12 used in the method of this invention preferably have a diameter between about 50 and 250 nanometers. These particles 12 may be synthesized using the technique disclosed hereinbelow. Alternatively they currently may be obtained commercially from Polysciences, Inc. of Warrington, Pa.

The particles 12 are generally stored in a dispersion including a detergent and relatively small amounts of an electrolyte. They are first cleaned of the electrolyte and surfactant impurities. This cleaning may be accomplished by dialysis against a bath of doubly distilled water containing a mixed bed ion exchange resin. After dialysis, the particles 12 may be stored in a bath of, preferably, 10% by weight suspension of ion exchange resin called Analytical Grade AG501X8 mixed bed resin obtainable from Bio-Rad of Richmond, Calif. The ion exchange resin should be cleaned prior to use through a suitable procedure such as that taught by Vanderhoff, et al. in the *Journal of Colloid Interface Science*, 1968, 28,336-337.

In the form illustrated in FIG. 1, the particles 12 are contained in a medium 14 which may be water, glycerol, ethylene glycol, methanol, ethanol, dimethyl sulfoxide, phenyl methyl sulfoxide, dioxane, dimethylformamide, polyethylene glycol, or glycerine, or any material possessing similar properties. The particles 12 within medium 14 in the form shown are placed in a generally rectangular chamber 16 which is sealed by cover 28. Chamber 16 is, preferably, composed of quartz, LEXAN or LEXAN-coated glass. Chamber 16 has bottom portion 18, and upstanding sidewalls 20, 22, 24 and 26. The suspension composed of particles 12 and medium 14 is diluted with deionized, doubly distilled water to provide a partial volume fraction in the range of about 0.5 to 75 percent. Chamber 16 is then sealed with air-tight cover 28. Sealed chamber 16 is then placed in room temperature water 30 in outer container 32 for a period of time adequate to allow the array to crystallize. This environment should also be perturbation-free. Geometric ordering of the crystalline structure then occurs.

Figure 2:
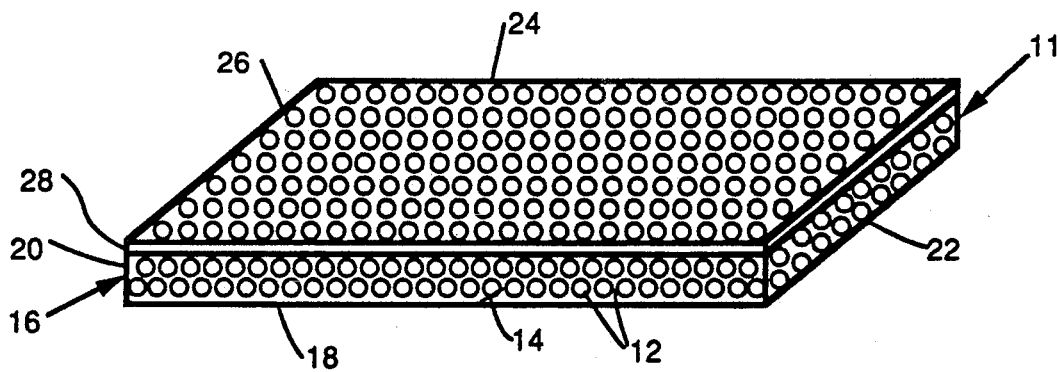
FIG. 2 is a schematic illustration of a solid crystalline array of polystyrene particles created in accordance with the method of the present invention.

FIG. 2 shows chamber 16 after removal from outer container 32. The particles 12 are packed in an ordered array 11 within chamber 16.

Turning now to further details of the method of the present invention, various aspects of the method of forming a solid crystalline structure are discussed.

In accordance with one aspect of the invention, any suitable solvent such as benzene, toluene and chloroform is added to preferably a polymer latex solution and this is added to medium 14 (FIG. 1) to fuse the particles 12 together and create an ordered array 11 as shown in FIG. 2. Preferably, polystyrene or polymethyl methacrylate spheres of about 50 to 250 nm diameter may be used. However, any suitable particle with a polymer outer shell may be used within the method of the present invention. The solvent, when added, serves to solubilize and swell the outer shells of particles 12.

Thereafter, the solvent medium 14 is removed. A suitable method of removal of the solvent medium 14 is preferably by a gentle evaporation wherein chamber 16 is at a temperature between about 20° and 30° C. until the desired evaporation takes place.

During solvent evaporation, the particles 12 condense into an ordered three-dimensional array 11 and the surfaces of the particles 12 are fused to one another. The resulting solid array 11 can then be removed from chamber 16. This array 11 constitutes a film which is self-supporting. The film diffracts and filters radiation of specific predetermined wavelengths. The wavelengths at which such a film is effective depend upon the resulting lattice structure, however, the wavelength bands may be on the order of about 2000 to 15,000 Å. In other words, the film can be effective from the ultraviolet region through the visible spectral region and then into and through the infrared region.

EXAMPLE 1

A crystalline colloidal structure was created by a method discussed hereinbelow. This method may be used to create a filtering device which Bragg diffracts a relatively narrow wavelength band with a high rejection ratio. Spheres 12 having a diameter of between about 200 and 250 nanometers and a density of between about 1 and 1.1 were used. The spheres 12 were added to a medium 14 of water containing about 0.1 percent toluene. Spheres 12 were added to a total volume density of about $10^{13}$ to $10^{14}$ particles per cubic centimeter.

This suspension was sealed in a chamber 16 (FIG. 1) made of quartz, having internal chamber dimensions of about 5 cm×5 cm×0.5 mm. The solvent was then evaporated by placing the chamber at room temperature for about twenty hours. A solid crystalline structure was formed therein, as evidenced by a change from a cloudy appearance to an irridescent appearance.

The solid crystalline structure created from array 11 was then removed from chamber 16. The structure so formed was determined to Bragg diffract above about 99 to 99.999% of light at a maximum of about 4800 to 5200 angstroms wide wavelength band centered at about 5000 angstroms while passing about 60 to 80% of the light at adjacent wavelengths.

The filtering device so produced as a narrow band filter would be quite useful for many applications, such as goggles for filtering laser light from a pilot's eyes or for a windshield on an airplane or space vehicle. Alternatively, the material may be used in rejecting a narrow wavelength band for scientific instrumentation or in the field of optics.

In accordance with another aspect of the invention a method for preparing a solid filter by polymerization of the medium around the spheres involves addition of at least one of acrylamide and bisacrylamide and an ultraviolet photoinitiator to a colloidal solution such as that described hereinbefore. The solution is preferably contained between two quartz plates. The solution is then exposed to ultraviolet radiation which effects the desired polymerization.

In accordance with yet another aspect of the invention, a fabrication method for production of monodisperse silica spheres to be used to construct a filtering device in accordance with the method of the present invention will be disclosed. Silica particles having sulfonate groups on their surfaces were used. A preferred sulfonate material is 2-(4 chlorosulfonyl phenyl) ethyl trimethoxy silane. The resultant sulfonate groups on the surface of particles are strong acid groups which dissociate to provide negative charges on the surface of the particles, which in this case are preferably spherical. It should be understood, however, that positively charged particles in lieu of negative particles may also be utilized within the scope of the present invention.

Furthermore, in accordance with this aspect of the invention, particles self-assemble into a three-dimensional array which will diffract light. The medium in which particles are dispersed may be adjusted to vary the interparticle interactions. As the medium evaporates, the particles have a high density within the medium. The adjustments may be made by including in the medium compounds such as NaCl, other salts or more broadly (a) any ionic compound or (b) any nonionic compounds having different dielectric constants. Other compounds such as styrene or silicone oil, for example, leave a residue of a material around the particles. This residue will not evaporate when the remainder of medium evaporates and it will tend to seal the spaces between the particles. This method results in a three-dimensional array having a high particle volume fraction. The material solidifies to form a homogenous solid crystalline structure which diffracts radiation. While we have used acidic materials on the surface of the particles, it is also within the scope of the present invention to use basic materials for this purpose such as quaternary amines, for example. One of the primary considerations is that the particles be electrically charged and the residue material adheres to the surface thereof.

EXAMPLE 2

Silica spheres were produced by polymerizing tetraethyl orthosilicate in a water-ethanol-ammonium hydroxide mixture using the Stöber process. The spheres were then silanized with 2-(4 chlorosulfonyl phenyl) ethyl trimethoxy silane. The spheres were allowed to self-assemble into a three-dimensional array 11 (FIG. 2) in the manner hereinbefore discussed within a medium such as water. Thereafter, evaporation was then facilitated. The array was removed from chamber 16 and a homogenous solid crystalline structure was present. The structure so created was determined to Bragg diffract about 99 to 99.999% of the light at a maximum of about 4800 to 5200 angstroms wide wavelength band centered at about 5000 angstroms, while passing about 60 to 80% of the light at adjacent wavelengths.

In accordance with another aspect of the invention, a method is described with reference to FIG. 3. Polystyrene particles 34 are introduced into chamber 35 which is composed of preferably two $SnO_2$-coated quartz plates, 41 and 43. Particles 34 are sandwiched between plates 41 and 43. The chamber 35 contains a medium selected from the group consisting of water, methanol and ethanol, and a monomer such as acrylamide, bisacrylamide, methyl methacrylate or hydroxy methyl methacrylate. Chamber 35 has a suitable electric field placed across it as schematically shown by wire 37 and voltage source 39. The electric field causes upper plate 41 to be negatively charged and lower plate 43 to be positively charged. The potential across the chamber 35 is preferably about 20 to 30 volts/cm. The field is preferably applied to chamber 35 for about 5 to 10 minutes. The particles 34, being negatively charged, are attracted in the direction 47 due to the electric field. They migrate towards lower plate 43 and are packed in an ordered array against lower plate 43 in the manner shown in FIGS. 3 and 3A. Particles 34 migrate due to negatively charged sulfonates on their surfaces. Of course, it should be understood that positively charged particles could be used which would then require an appropriate adjustment in the orientation of the electric field. The surface of the particles may be positively charged using quaternary amines on the surface of the particles in which case they would migrate towards the opposite electrode. After about 5 to 10 minutes, the particles 34 become packed in the array designated generally as 49 (FIG. 3). The monomer in the liquid medium polymerizes around the particles. The polymerization may be initiated either chemically or electrochemically. The structure thereafter is gelled and solidified as the medium evaporates. A more rigid solid can be obtained by allowing the liquid medium to evaporate and condense the ordered particles into a solid array. The resulting filter is capable of diffracting or filtering radiation in accordance with lattice spacing of the array 49.

EXAMPLE 3

An electrophoretic formation method as discussed hereinbefore was practiced employing polystyrene spheres. Spheres having a diameter of about 200 to 250 nanometers and a density of between about 1 and 1.1 were used. Spheres 34 (FIG. 3) were placed in a medium 36 of water containing about 0.1 percent toluene. The density of spheres 34 within medium 36 was between about $10^{12}$ and $10^{14}$. The suspension was placed in chamber 35 made of tin oxide coated glass and having interior dimensions of about 50 millimeters×50 millimeters×0.5 millimeters.

An electric field of about 20 to 30 volts/cm was placed across chamber 35. The electric field caused the negatively-charged spheres 34 to migrate towards positive end 43. This was allowed to occur for between about 5 and 10 minutes. Thereafter, evaporation was facilitated by placing chamber 35 in an atmosphere of air kept at about room temperature, for about 16 to 20 hours. A filter film having a thickness of about 0.01 to 0.1 mm was produced which was determined to Bragg diffract above about 99 to 99 999% of light at a maximum of about 4800 to 5200 angstroms wide wavelength band centered at about 5000 angstroms while passing about 60 to 80% of the light at adjacent wavelengths.

It should be understood that the electrophoretic method disclosed herein is not the only method of packing the particles which are spheres in the exemplary embodiment. There are other methods known to those skilled in the art including gravitational settling and centrifugal settling.

With reference to FIGS. 4 and 5, the performance of the filtering device is illustrated. In FIG. 4, a beam 50 of electromagnetic radiation is incident upon a filtering device 52, made in accordance with the present invention, at an angle A. A transmitted beam 54 departs the filtering device 52 at a substantially equal angle B. A beam 56 of a narrow wavelength band is Bragg diffracted from the filtering device 52 at an angle C. In this manner, the beam 56 is effectively filtered from beam 50. The wavelength of beam 56 satisfies the Bragg diffraction equation:

$$n\lambda = 2d \sin A$$

wherein "d" represents the lattice spacing between each sphere 12 (FIG. 1) within the solid structure, "n" represents any integer which will preferably be about 1, "A" is angle A, and $\lambda$ represents wavelength.

The curve 60 of FIG. 5 illustrates that the wavelength band which is Bragg diffracted by the filtering device 52 made in accordance with the present invention may be quite narrow. Referring still to FIG. 5, curve 73 depicts that the central wavelength of the narrow wavelength band filtered by filtering device 52 is dependent upon the incident angle as determined by the Bragg diffraction equation set forth hereinbefore. Accordingly, it will be appreciated that the filtering device is "tunable" to filter a range of different wavelength bands, by controlling and appropriately adjusting the orientation between the filtering device 52 and the incident electromagnetic radiation.

It will be appreciated therefore that the invention has provided a method for creating a solid filtering device which is capable of Bragg diffracting narrow bands of radiation. The disclosure includes several embodiments and aspects of the method of the invention which provides for versatility in preparing filtering devices for desired applications.

Whereas particular aspects of the method of the present invention and particular embodiments of the invention have been described hereinbefore for purposes of illustration, it will be appreciated by those skilled in the art that numerous variations of the details may be made without departing from the invention as described in the appended claims.

What is claimed is:

1. A method of making a solid filtering material for filtering a predetermined wavelength band from a broad spectrum of radiation, comprising the steps of
    creating a colloidal structure by providing particles with a polymeric outer shell dispersed in a crystalline array within a first liquid medium,
    introducing a second substance comprising a solvent into said colloidal structure to solubilize and swell the outer shells of said particles, and
    evaporating at least a substantial portion of said second substance and said first liquid medium from said structure to condense said particles into a solid three-dimensional, ordered array having a lattice spacing structure, which is substantially equal to said predetermined wavelength band, and to fuse surfaces of said particles to one another.

2. The method of claim 1 including providing as said particles ionized particles such that charges of said ionized particles create repulsion forces to enhance said spacing structure of said particles.

3. The method of claim 2 including providing as said particles, particles selected from the group consisting of polystyrene, polymethylmethacrylate, silicon dioxide, aluminum oxide and polytetrafluoroethylene.

4. The method of claim 1 including providing as said first liquid medium a substance selected from the group consisting of water, glycerol, ethylene glycol, methanol, ethanol, dimethyl sulfoxide, phenyl methyl sulfoxide, dioxane, dimethylformamide, polyethylene glycol and glycerine.

5. The method of claim 1 including selecting said second substance from the group consisting of polymer latex and polymethylmethacrylate.

6. The method of claim 1 including selecting said solvent from the group consisting of benzene, toluene and chloroform.

7. The method of claim 1 including evaporating at least a substantial portion of said second substance and said first liquid medium at room temperature for a period of time adequate to allow said ordered array to crystallize.

8. The method of claim 1 therein said particles of said colloidal structure are spheres of a diameter of about 50 to 250 nm.

9. A method of making a solid filtering material for filtering a predetermined wavelength band from a broad spectrum of radiation comprising creating a colloidal structure by providing ionized particles of the same polarity dispersed in a crystalline array established by the relative repulsion of said ionized particles within a medium, adding a polymerization inducing substance to said medium, and polymerizing said medium around said particles to form a solid, ordered array having a lattice spacing structure, said spacing structure being substantially equal to said predetermined wavelength band.

10. The method of claim 9 including providing as said polymerization-inducing substance a mixture composed of at least one of acrylamide and bisacrylamide, and an ultraviolet nonionic photoinitiator, and exposing said medium to ultraviolet radiation to induce said polymerizing of said medium.

11. A method of making a solid filtering material for filtering a predetermined wavelength band from a broad spectrum comprising the steps of (a) coating surfaces of silica particles with a sulfonate-containing material on outer surfaces of said particles, (b) adding said particles to a medium and allowing them to self-assemble into a three-dimensional array to create a colloidal structure, and (c) evaporating at least a substantial portion of said medium out of said colloidal structure to solidify said structure to create a lattice structure having spacing substantially equal to said predetermined wavelength band.

12. The method of claim 11 including providing as said sulfonate group on said outer shell of said particles 2- (4 chlorosulfonyl phenyl) ethyl trimethoxy silane.

13. The method of claim 11 including adjusting said medium to vary interparticle interactions by including in said medium (a) ionic compounds or (b) compounds having different dielectric constants such that said particles have a predetermined density within the medium after a portion of the medium is removed.

14. The method of claim 13 including leaving a residue around said particles to facilitate formation of said lattice spacing.

15. A method of creating a solid filtering material for filtering a predetermined wavelength. band from a broad spectrum of radiation, comprising the steps of creating a colloidal structure composed of electrostatically-charged particles suspended within an electrically neutral medium comprising a monomer, placing a bipolar electric field across said structure to facilitate travel of said particles toward one pole of said field and packing of said particles in an ordered array, and polymerizing said monomer around said particles and allowing said structure to solidify into a lattice structure having spacing substantially equal to said predetermined wavelength band.

16. The method of claim 15 including providing said colloidal structure contained between two $SnO_2$-coated quartz plates.

17. The method of claim 15 including initiating said polymerization chemically.

18. The method of claim 15 including initiating said polymerization electrochemically.

* * * * *

UNITED STATES PATENT AND TRADEMARK OFFICE
CERTIFICATE OF CORRECTION

PATENT NO. : 5,281,370
DATED : January 25, 1994
INVENTOR(S) : SANFORD A. ASHER and SESH JAGANNATHAN It is certified that error appears in the above-identified patent and that said Letters Patent is hereby corrected as shown below:

Column 1, line 6, "Contract F3315-88-C-5432" should be
-- Contract F33615-88-C-5432 --.

Column 7, line 59, "99 to 99 999%" should be -- 99 to 99.999% --.

Claim 6, column 9, line 19, -- second substance -- should be inserted after "solvent".

Claim 8, column 9, line 27, "therein" should be -- wherein --.

Signed and Sealed this

Twelfth Day of September, 1995

Attest:

BRUCE LEHMAN

Attesting Officer

Commissioner of Patents and Trademarks